(12) United States Patent
Park et al.

(10) Patent No.: US 10,651,331 B2
(45) Date of Patent: May 12, 2020

(54) SOLAR CELL MODULE USING SEMICONDUCTOR NANOCRYSTALS

(71) Applicant: LG ELECTRONICS INC., Seoul (KR)

(72) Inventors: Hyunjung Park, Changwon-si (KR); Jiweon Jeong, Changwon-si (KR)

(73) Assignee: LG ELECTRONICS INC., Seoul (KR)

(*) Notice: Subject to any disclaimer, the term of this patent is extended or adjusted under 35 U.S.C. 154(b) by 0 days.

(21) Appl. No.: 14/866,447

(22) Filed: Sep. 25, 2015

(65) Prior Publication Data
US 2016/0020350 A1 Jan. 21, 2016

Related U.S. Application Data

(62) Division of application No. 12/969,062, filed on Dec. 15, 2010.

(30) Foreign Application Priority Data

Dec. 15, 2009 (KR) .................. 10-2009-0124747

(51) Int. Cl.
H01L 31/055 (2014.01)
H01L 31/0216 (2014.01)
H01L 31/048 (2014.01)
H01L 31/0296 (2006.01)

(52) U.S. Cl.
CPC ........ *H01L 31/055* (2013.01); *H01L 31/0296* (2013.01); *H01L 31/02168* (2013.01); *H01L 31/048* (2013.01); *Y02E 10/52* (2013.01); *Y02E 10/542* (2013.01)

(58) Field of Classification Search
CPC ..... H01L 31/00; H01L 31/02; H01L 31/0216; H01L 31/02162; H01L 31/02167; H01L 31/02168; H01L 31/0232; H01L 31/054; H01L 31/055
See application file for complete search history.

(56) References Cited

U.S. PATENT DOCUMENTS 5,279,682 A * 1/1994 Wald ............... H01L 31/022425
136/256
6,130,379 A 10/2000 Shiotsuka et al.
(Continued)

FOREIGN PATENT DOCUMENTS

CN 2011149872 Y 11/2008
CN 101593783 A 12/2009
(Continued)

OTHER PUBLICATIONS

Definition of "on" retrieved from http://www.dictionary.com/browse/on on Feb. 22, 2017.*
(Continued)

*Primary Examiner* — Christina Chern
(74) *Attorney, Agent, or Firm* — Birch, Stewart, Kolasch & Birch, LLP

(57) ABSTRACT

A solar cell includes at least one photoelectric conversion layer; and at least one layer provided on a surface of the photoelectric conversion layer upon which light is incident, wherein the at least one layer contains semiconductor nanocrystals.

14 Claims, 5 Drawing Sheets

(56) References Cited

U.S. PATENT DOCUMENTS

| | | | |
|---|---|---|---|
| 6,384,318 B1* | 5/2002 | Nomura | C03C 17/009 136/256 |
| 2004/0011395 A1* | 1/2004 | Nicoletti | F24J 2/085 136/246 |
| 2005/0195486 A1* | 9/2005 | Sasaki | G02B 1/11 359/580 |
| 2006/0068154 A1 | 3/2006 | Parce et al. | |
| 2006/0169971 A1 | 8/2006 | Cho et al. | |
| 2006/0219287 A1 | 10/2006 | Huang | |
| 2007/0116966 A1* | 5/2007 | Mellott | C03C 17/3417 428/432 |
| 2008/0216894 A1 | 9/2008 | Hammond | |
| 2008/0236667 A1 | 10/2008 | Naum et al. | |
| 2009/0050201 A1 | 2/2009 | Fortmann | |
| 2009/0095341 A1 | 4/2009 | Pfenninger et al. | |
| 2010/0024880 A1 | 2/2010 | Lee | |
| 2010/0065117 A1 | 3/2010 | Kim et al. | |
| 2010/0163104 A1* | 7/2010 | Tseng | H01L 31/022425 136/256 |

FOREIGN PATENT DOCUMENTS

| | | |
|---|---|---|
| CN | 101728446 A | 6/2010 |
| EP | 2105968 A1 | 9/2009 |
| KR | 10-2009-0020590 A | 2/2009 |
| WO | WO 2008/072828 A1 | 6/2008 |

OTHER PUBLICATIONS

Chan et al., "Incorporation of luminescent nanocrystals into monodisperse core—shell silica microspheres," Advanced Materials, vol. 16, No. 23-24, Dec. 17, 2004 (published online Nov. 17, 2004), pp. 2092-2097.

* cited by examiner

SOLAR CELL MODULE USING SEMICONDUCTOR NANOCRYSTALS

CROSS-REFERENCE TO RELATED APPLICATION

This application is a divisional of application Ser. No. 12/969,062 filed on Dec. 15, 2010, which claims priority to and the benefit of Korean Application No. 10-2009-0124747 filed on Dec. 15, 2009 in the Korean Intellectual Property Office. The disclosures of these applications are incorporated herein by reference.

BACKGROUND OF THE INVENTION

Field of the Invention

Embodiments of the present invention relate to a solar cell and a solar cell module manufactured using a material having a down converting characteristic, and more particularly to a solar cell and a solar cell module which increases the number of photons incident upon solar cells or absorption rate of incident light, and thus increases an amount of generated current to improve photoelectric conversion efficiency thereof.

Description of the Related Art

Recently, interest in new renewable energy sources has risen due to problems, such as a great rise in oil prices, problems of the environment, depletion of fossil energy, disposal of waste generated in nuclear power generation, and resistance to new power plant construction projects. Among new renewable energy sources, research and development of solar cells serving as a pollution-free energy source have been vigorously carried out.

Solar cells are devices which convert light energy into electric energy using a photovoltaic effect. Solar cells have advantages, such as being non-polluting, having an infinite energy resource, and having a life-span that is semi-permanent, and are expected as an energy source which eventually solves energy problems of humanity as well as a myriad of environmental problems.

Solar cells can be grouped into silicon solar cells, thin film solar cells, dye-sensitized solar cells, organic compound solar cells and so on, according to materials constituting the solar cells. Since crystalline silicon solar cells among these various types of solar cells make up the majority of global solar cell production, and have efficiency higher than other solar cells, techniques to lower the unit cost of production of the crystalline silicon solar cells have been continuously developed, and the crystalline silicon solar cells are known as the most popular solar cells.

In general, when commercialized, solar cells are manufactured to have a module structure in which the solar cells performing a photoelectric conversion function are packaged with protective members, fillers, and reinforcing members.

Therefore, in order to optimize the photoelectric efficiency of the solar cells, research and development of the solar cell module structure to achieve high efficiency are required. Embodiments of the present invention propose a technique to improve the solar cells and the solar cell module so as to increase the photoelectric conversion efficiency of the solar cells and the solar cell modules.

SUMMARY OF THE INVENTION

An object of the present invention is to provide a solar cell and a solar cell module thereof which is applicable to various solar cells, while utilizing a manufacturing process of the solar cell module using solar cells, so as to increase photoelectric conversion efficiency.

Another object of the present invention is to provide a solar cell and a solar cell module thereof manufactured using an energy down converting material which converts light incident upon the solar cell to increase an amount of absorption rate of the light or the number of photons of the light, so as to increase photoelectric conversion efficiency of the solar cell.

The objects of the present invention are not limited to the above-mentioned object and other objects that have not been mentioned above will become evident to those skilled in the art from the following description.

To achieve the above objects, there is provided a solar cell module including solar cells according to an example embodiment of the present invention, and including an insertion layer containing semiconductor nanocrystals having down converting characteristics for converting incident light into emitted light having energy lower than that of the incident light, thereby increasing the number of photons of the incident light or the amount of absorption rate of the incident light and thus increasing photoelectric conversion efficiency of the solar cells.

In more detail, the solar cell module may include a plurality of solar cells each including at least one photoelectric conversion layer, at least one transparent member provided on upper surfaces of the plurality of solar cells, and a filling layer to seal the plurality of solar cells, wherein at least one layer selected from the at least one transparent member and the filling layer contains semiconductor nanocrystals.

The solar cell module may further include a back sheet provided on lower surfaces of the plurality of solar cells.

To achieve the above objects, there is provided a solar cell module according to another example embodiment of the present invention, including solar cells each including at least one semiconductor layer and at least one layer, such as at least one anti-reflection film, provided on surfaces of the solar cells upon which light is incident, at least one transparent member provided on upper surfaces of the solar cells, and a filling layer to seal the solar cells. In this instance, at least one layer selected from the at least one transparent member, the at least one transparent member, and the filling layer contains semiconductor nanocrystals which emit light at energy lower than that of the incident light.

That is, any one layer selected from a plurality of layers of the anti-reflection film, any one transparent member selected from a plurality of transparent members, or the filling layer may contain the semiconductor nanocrystals dispersed therein.

Instead of one the at least one layer selected from the above layers, plural layers selected from the above layers may contain the semiconductor nanocrystals.

An uppermost anti-reflection film of a plurality of anti-reflection film may contain the semiconductor nanocrystals.

That is, a plurality of anti-reflection films may be formed on front surfaces of the solar cells. In this instance, any one of the plurality of anti-reflection films may contain the semiconductor nanocrystals, and the uppermost anti-reflection film close to a surface of the solar cell module upon which light is incident may preferably, but not necessarily, contain the semiconductor nanocrystals.

The at least one transparent member may include a transparent resin film. The at least one transparent member may include a rigid transparent substrate and a transparent resin film, and the transparent resin film may contain the semiconductor nanocrystals. The rigid transparent substrate may be a glass substrate or a transparent polymeric plastic substrate.

If the at least one transparent member includes the rigid transparent substrate and the transparent resin film, the transparent resin film may be formed on at least one of a front surface and a rear surface of the rigid transparent substrate.

To achieve the above objects, there is provided a solar cell according to another example embodiment of the present invention, including at least one photoelectric conversion layer and at least one layer, such as at least one anti-reflection film, provided on a surface of the at least one photoelectric conversion layer upon which light is incident, wherein the at least one anti-reflection film contains semiconductor nanocrystals.

The at least one anti-reflection film may include two or more layers, and an uppermost layer of the two or more layers may contain the semiconductor nanocrystals.

The at least one photoelectric conversion layer may include a first conductivity-type semiconductor substrate and an emitter layer doped with a second conductivity-type impurity provided on the first conductivity-type semiconductor substrate, and the solar cell may further include first electrodes connected to the emitter layer and a second electrode connected to the first conductivity-type semiconductor substrate.

The at least one anti-reflection film may include a first anti-reflection film including at least one layer and formed on an upper surface of the emitter layer such that first electrodes are connected to the emitter layer through the first anti-reflection film, and a second anti-reflection film formed on a front surface of the first anti-reflection film, and containing the semiconductor nanocrystals.

To achieve the above objects, there is provided a solar cell module according to another example embodiment of the present invention, including a solar cell layer in which a plurality of solar cells having at least one semiconductor layer is connected in series, a back sheet provided on a lower surface of the solar cell layer, a transparent member provided on an upper surface of the solar cell layer, and a filling layer to seal the plurality of solar cells in the solar cell layer, wherein at least one layer selected from the filling layer and the transparent member contains semiconductor nanocrystals which converts incident light into light having energy lower than that of the incident light and then emits the converted light having the lower energy.

BRIEF DESCRIPTION OF THE DRAWINGS

The above and other objects, features and other advantages of the present invention will be more clearly understood from the following detailed description taken in conjunction with the accompanying drawings, in which.

DETAILED DESCRIPTION OF THE EMBODIMENTS

The advantages and features of embodiments of the present invention and the way in which they are attained will become apparent with reference to the embodiments described below in conjunction with the accompanying drawings.

FIGS. 1 to 5 are longitudinal-sectional views illustrating structures of solar cells using semiconductor nanocrystals in accordance with embodiments of the present invention.

Figure 1:
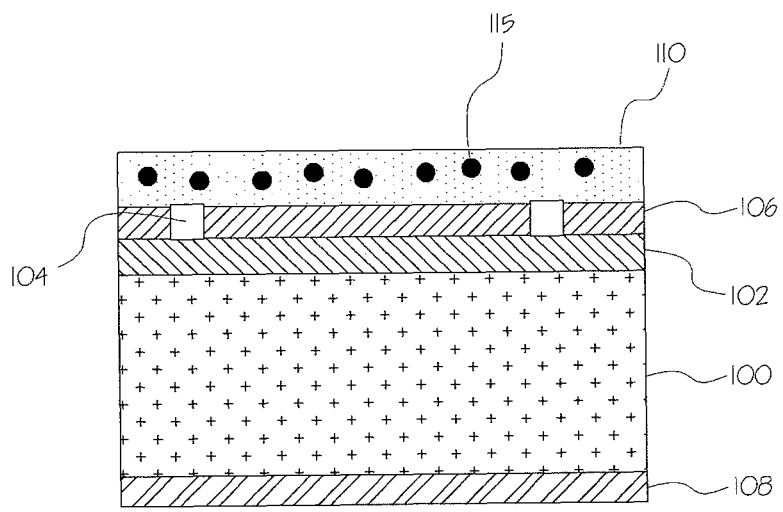
FIGS. 1 to 5 are longitudinal-sectional views illustrating structures of solar cells using semiconductor nanocrystals in accordance with embodiments of the present invention.

First, a structure of a solar cell in accordance with one embodiment of the present invention, as shown in FIG. 1, is as follows. That is, the solar cell of FIG. 1 includes an emitter layer 102 provided on a front surface (or a light incident surface) of a silicon semiconductor substrate 100 and doped with a semiconductor impurity of a type differing from a semiconductor impurity of the silicon semiconductor substrate 100, an anti-reflection film 106 formed on the front surface of the emitter layer 102, front electrodes 104 formed on the emitter layer 102 by a selective patterning, and a rear electrode 108 formed on a rear surface (or a surface opposite to the light incident surface) of the silicon semiconductor substrate 100. Such solar cells are photoelectric conversion members, which absorb light, such as sunlight, and convert the light into electric energy.

In accordance with this embodiment, the silicon semiconductor substrate 100 may be a p-type silicon semiconductor substrate, and the emitter layer 102 may be an n-type semiconductor layer.

Although FIG. 1 illustrates a structure of a particular solar cell, a solar cell usable herein is not limited to the above structure and may be manufactured using various structures and types, such as a crystalline type or a thin film type.

Structures of solar cells which will be described later with reference to FIGS. 2 to 5 employ the above described solar cell, and a detailed description thereof will be omitted, if necessary.

The solar cell of FIG. 1 further includes a filling layer 110 formed on an upper surface (or a front surface) of the solar cell. Semiconductor nanocrystals 115 for emitting light at energy lower than energy of incident light are dispersed within the filling layer 110. An amount of the semiconductor nanocrystals 115 dispersed in the filling layer 110 may be about 1% to 10% by weight relative to a weight of the filling layer 110.

The filling layer 110 of FIG. 1 within which the semiconductor nanocrystals 115 are dispersed may be made of Ethylene Vinyl Acetate copolymer (EVA) which is a filling material for solar cells. The filling layer 110 is stacked on the solar cell by applying a solution, in which the semiconductor nanocrystals 115 are mixed and dispersed within an EVA material, to the solar cell. Here, a stacking temperature of the filling layer 110 may be about 300~400° C.

Figure 2:
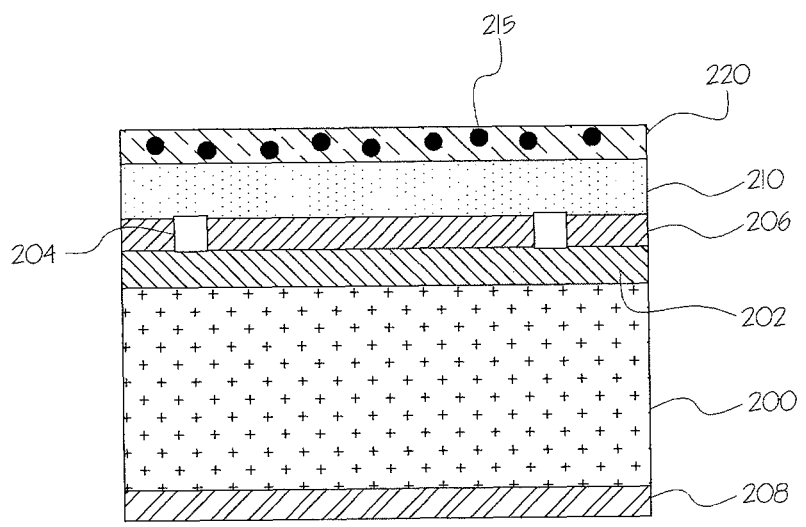

In a solar cell in accordance with another embodiment of the present invention, as shown in FIG. 2, a separate film containing semiconductor nanocrystals 215 is formed on a filling layer 210 on a solar cell. That is, the solar cell in accordance with this embodiment has a structure in which a separate transparent resin film 220 within which the semiconductor nanocrystals 215 are dispersed is formed on the filling layer 210.

The solar cell in accordance with this embodiment includes a silicon substrate 200, an emitter layer 202 formed on the silicon substrate 200, an anti-reflection film 206 and front electrodes 204 formed on the front surface of the emitter layer 202, and a rear electrode 208. Further, the filling layer 210 made of EVA, and the transparent resin film 220 in which the semiconductor nanocrystals 215 are dispersed within a transparent resin film material thereof, are respectively formed on the solar cell.

When a corresponding dispersion solution is applied to the solar cell, the dispersion solution is treated at a temperature less than a melting point of the EVA so as to prevent or reduce the filling layer 210, made of EVA and formed under the transparent resin film 220 (which is an arrangement that is different from the embodiment of FIG. 1) from melting. Therefore, the dispersion solution is preferably, but not necessarily, treated at a temperature of about 150° C.

Figure 3:
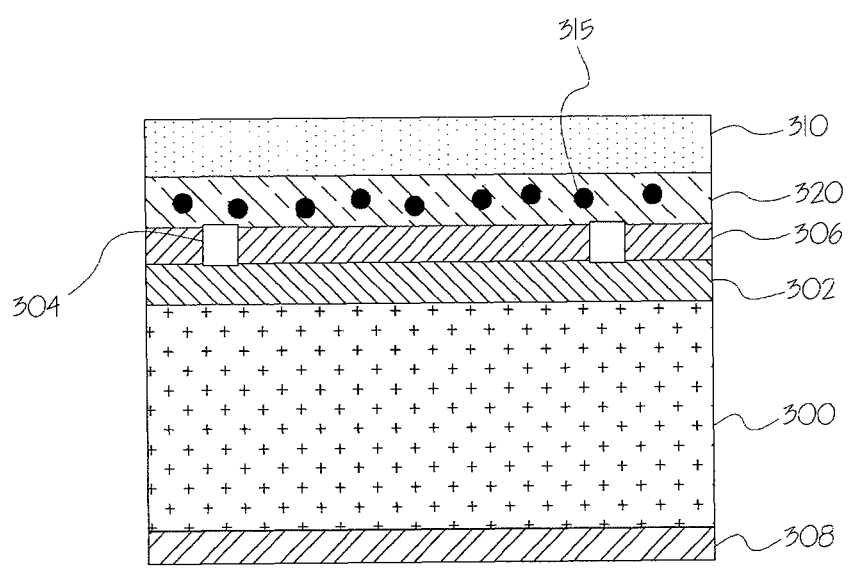

FIG. 3 illustrates a structure of a solar cell module in accordance with another embodiment of the present invention. With reference to FIG. 3, the solar cell in accordance with this embodiment includes a silicon substrate 300, an emitter layer 302 formed on the silicon substrate 300, an anti-reflection film 306 and front electrodes 304 formed on the front surface of the emitter layer 302, a rear electrode 308, and another anti-reflection film 320 formed on the solar cell.

That is, at least one anti-reflection film may be added to the front surface of the solar cell module, upon which the incident light, such as sunlight, is incident. At least one of the at least one anti-reflection film may contain semiconductor nanocrystals. Preferably, but not necessarily, when there are a plurality of anti-reflection films such as an anti-reflection layer 306 and another anti-reflection layer 320, an uppermost anti-reflection film 320 may contain the semiconductor nanocrystals 315. Since this structure allows the anti-reflection film 320 to serve to prevent or reduce scattering of light of a short wavelength as well as to prevent or reduce reflection of the incident light so as to contribute to light absorption, the uppermost anti-reflection film 320 preferably, but not necessarily, contains the semiconductor nanocrystals 315.

Dispersion of the semiconductor nanocrystals 315 in the anti-reflection film 320 is achieved through a low-temperature solution process to stabilize material properties, and such a process is preferably, but not necessarily, carried out at a temperature of about 300~400° C.

The plural anti-reflection films 306 and 320 are preferably, but not necessarily, formed such that refractive indices of the anti-reflection films 306 and 320 are sequentially increased as the anti-reflection films 306 and 320 become increasingly distant from the surface upon which incident light is incident. Preferably, but not necessarily, the refractive index of the uppermost anti-reflection film 320 containing the semiconductor nanocrystals 315 is about 1.5~2.0.

In order to form the solar cell including the anti-reflection film 320 containing the semiconductor nanocrystals 315, a filling layer 310 made of Ethylene Vinyl Acetate copolymer (EVA) is formed on the uppermost anti-reflection film 320 containing the semiconductor nanocrystals 315.

Figure 4:
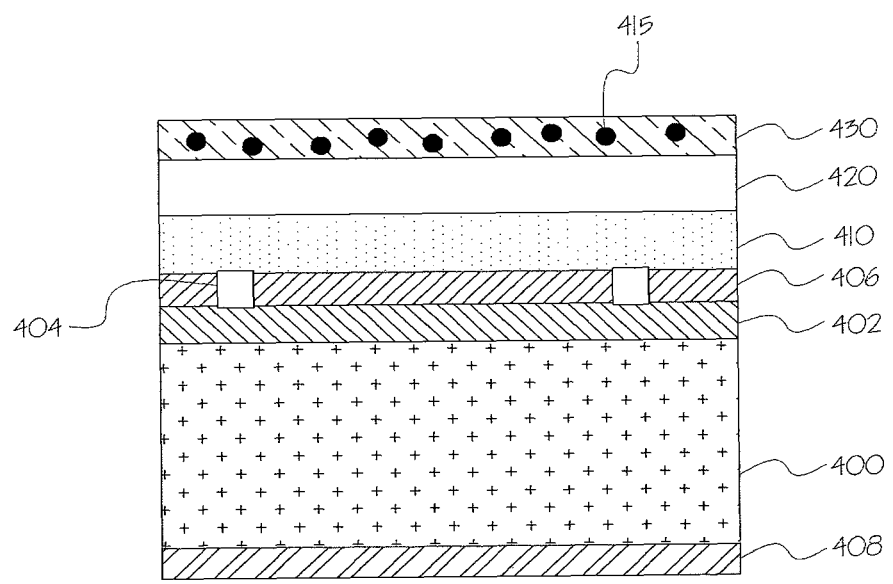
Figure 5:
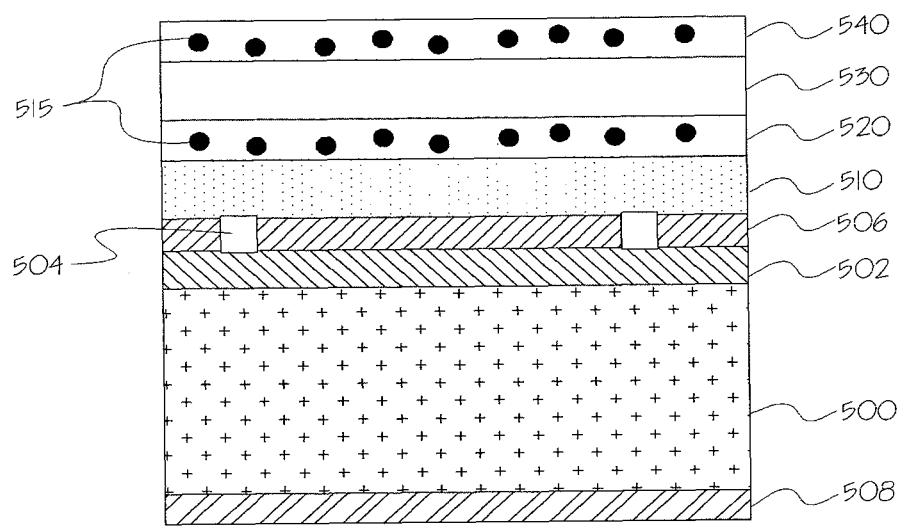

FIGS. 4 and 5 illustrate structures of solar cells using semiconductor nanocrystals in accordance with other embodiments of the present invention. With reference to FIGS. 4 and 5, a plurality of transparent members are formed on solar cells.

The solar cells of FIGS. 4 and 5 respectively include silicon substrates 400 and 500, emitter layers 402 and 502 formed on the silicon substrates 400 and 500, anti-reflection films 406 and 506 and front electrodes 404 and 504 formed on the front surfaces of the emitter layers 402 and 502, and rear electrodes 408 and 508.

The transparent members are formed on the respective solar cells. In the instance of FIG. 4, a rigid transparent substrate 420, i.e., a glass substrate, and a flexible transparent resin film 430 are formed on a filling layer 410 formed on the solar cell. The transparent resin film 430 contains semiconductor nanocrystals 415 having a down converting function.

The transparent resin film 430 containing the semiconductor nanocrystals 415 may be formed as a plurality of layers, and the semiconductor nanocrystals 415 having the down converting function may be dispersed within an uppermost layer of the plurality of layers of the transparent resin film 430.

The transparent resin film 430 containing the semiconductor nanocrystals 415 may be selectively formed on one surface of the rigid transparent substrate 420, i.e., the front surface of the rigid transparent substrate 420 upon which light is incident or the rear surface of the rigid transparent substrate 420.

Further, since dispersion of the semiconductor nanocrystals 415 within the rigid transparent substrate 420 is difficult, a solution within which the semiconductor nanocrystals 415 are dispersed is applied to the flexible transparent resin film 430.

In the instance of FIG. 5, a filling layer 510 is formed on the solar cell, a rigid transparent substrate 530 serving as a transparent member is formed on the filling layer 510, and transparent resin films 540 and 520 are respectively formed on the upper surface (or the front surface) and the lower surface (or the rear surface) of the rigid transparent substrate 530.

Although this embodiment illustrates that both the transparent resin films 540 and 520 contain semiconductor nanocrystals 515, any one layer of the transparent resin film 540 formed on the upper surface of the rigid transparent substrate 530 and the transparent resin film 520 formed on the lower surface of the rigid transparent substrate 530 may contain the semiconductor nanocrystals 515.

FIGS. 6 to 9 are longitudinal-sectional views illustrating structures of solar cell modules using a plurality of solar cells in accordance with embodiments of the present invention.

First, in embodiments of the present invention, a plurality of solar cells are connected in series, and filling layers are formed to seal the plurality of solar cells. The filling layers may be formed on the upper surface (or the front surface) and the lower surface (or the rear surface) of a solar cell layer including the plurality of solar cells, and a transparent member may be formed on an upper surface (a front surface) or a lower surface (a rear surface) of an upper filling layer.

A back sheet may be provided on the lower surface of a lower filling layer, and a transparent resin film, a glass substrate, or both the transparent resin film and the glass substrate may be provided on the upper surface of the upper filling layer.

In embodiments of the present invention, at least one layer selected from the above-described transparent resin film, filling layers, and glass substrate may contain semiconductor nanocrystals which emit light having energy lower than that of the incident light. Consequently, photoelectric conversion efficiency of the solar cells may be improved or maximized.

Figure 6:
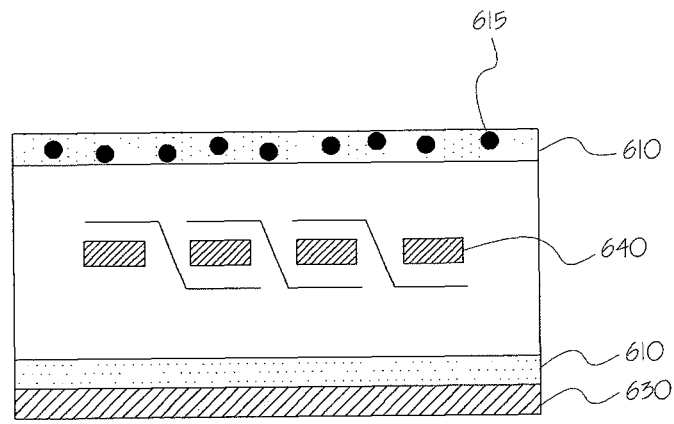
FIGS. 6 to 9 are longitudinal-sectional views illustrating structures of solar cell modules using a plurality of solar cells in accordance with embodiments of the present invention.

FIG. 6 is a structure of a solar cell module in accordance with one embodiment of the present invention, in which a filling layer 610 contains semiconductor nanocrystals 615, in a similar manner as the embodiment of FIG. 1.

When the solar cell module is formed, filling layers 610 are respectively formed or disposed on front surfaces and rear surfaces of a plurality of solar cells 640, which may be series connected, and are laminated by heat and pressure together with transparent members, such as a back sheet 630 and a glass substrate. Through such lamination, an upper filling layer 610 and a lower filling layer 610 are melted and hardened together, thereby completely sealing the plurality of solar cells 640. In this instance, only the upper filing layer 610 preferably, but not necessarily, contains the semiconductor nanocrystals 615. In this instance, the transparent resin film or the glass substrate may be formed or disposed on an upper surface of the upper filling layer 610, as needed or desired.

Figure 7:
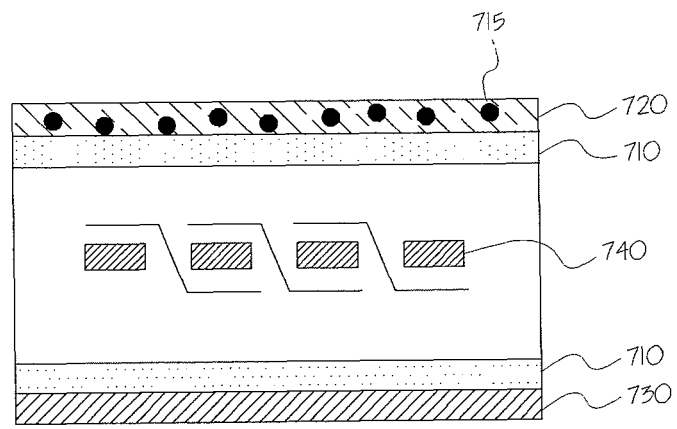

FIG. 7 is a structure of a solar cell module in accordance with another embodiment of the present invention, in which a separate transparent resin film 720 containing semiconductor nanocrystals 715 is formed or disposed on an upper surface of an upper filling layer 710, in a similar manner as the embodiment of FIG. 2. Although the transparent resin film 720 containing the semiconductor nanocrystals 715 may be formed or disposed on a front surface or a rear surface of the upper filling layer 710 in a similar manner as the embodiment of FIG. 2, this embodiment illustrates that the transparent resin film 720 is formed on the front surface of the upper filling layer 710. In the structure of FIG. 7, a glass substrate may be added to an upper surface of a solar cell layer of a plurality of solar cells 740, as needed or desired. The plurality of solar cells 740 may be series connected.

Figure 8:
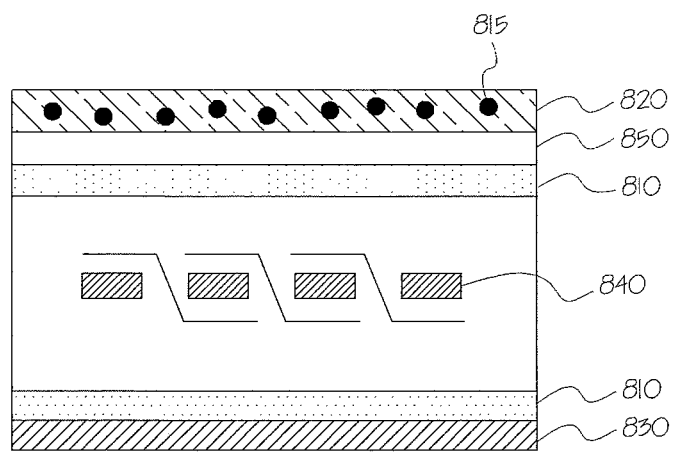

FIG. 8 is a structure of a solar cell module in accordance with another embodiment of the present invention, in which a transparent resin film 820 containing semiconductor nanocrystals 815 is formed or disposed on a glass substrate 850, in a similar manner as the embodiment of FIG. 4 or 5. Although the transparent resin film 820 containing the semiconductor nanocrystals 815 may be formed or disposed on a front surface or a rear surface of the glass substrate 850 in a similar manner as the embodiment of FIG. 4 or 5, this embodiment illustrates that the transparent resin film 820 is formed on the front surface of the glass substrate 850. A plurality of solar cells 840 may be series connected.

Figure 9:
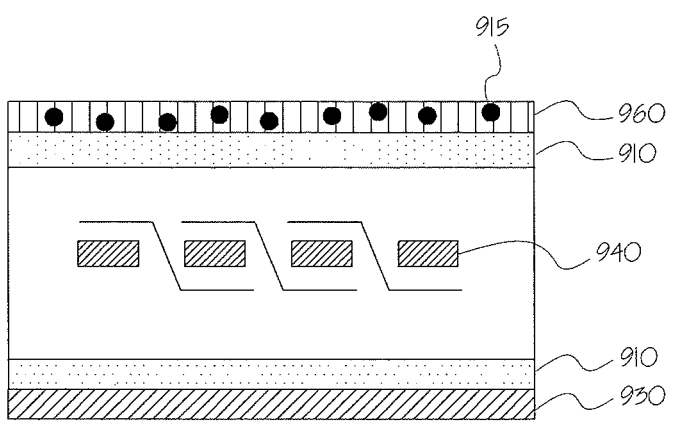

FIG. 9 is a structure of a solar cell module in accordance with another embodiment of the present invention, in which an anti-reflection film 960 containing semiconductor nanocrystals 915 is formed or disposed on front surfaces of a solar cell layer of a plurality of solar cells 940, in a similar manner as the embodiment of FIG. 2. The anti-reflection film 960 containing the semiconductor nanocrystals 915 may be formed as a single layer or a plurality of layers. In the structure of FIG. 9, a glass substrate may be added to the front surface (an upper surface) of the solar cell layer, as needed or desired.

With reference to FIGS. 6 to 9, back sheets 630, 730, 830, and 930 are selective components, and thus may be excluded in the present invention, as needed or desired. That is, in the solar cell module, glass substrates may be formed on the upper surface and the lower surface of the solar cell layer of the plurality of solar cells without the back sheet.

A solar cell and a module thereof in accordance with embodiments of the present invention are manufactured using an energy down converting material which converts light incident upon the solar cell or the module thereof to increase an amount of absorption rate of the light or the number of photons of the light, thereby increasing photoelectric conversion efficiency of overall solar cells or a module thereof.

In embodiments of the present invention, diameters and/or sizes of semiconductor nanocrystals, which may be dispersed within a layer, are not specifically limited. Further, the diameters and/or the sizes of the semiconductor nanocrystals which may be dispersed within a layer may be the same or different. Preferably, but not necessarily, the diameters and/or the sizes of the semiconductor nanocrystals may be nano-meter sized. The diameters of the semiconductor nanocrystals may be in the range of about 1 nm to 100 nm. Thus, the semiconductor nanocrystals may be particles, portions, pieces, or fragments.

The semiconductor nanocrystals may be nanocrystals of a material which converts a wavelength of light. That is, the semiconductor nanocrystals may be nanocrystals of a down converting material which converts incident light into light having energy of a lower level than that of the incident light and then emits the converted light.

Preferably, but not necessarily, the semiconductor nanocrystals may convert the incident light of a short wavelength having high energy, i.e., of a wavelength of about 300 nm to 500 nm, into emitted light of a long wavelength having lower energy, i.e., of a wavelength of about 600 nm to 1,100 nm. In addition, or alternatively, the semiconductor nanocrystals may convert a short wavelength component of high energy of the incident light, i.e., of a wavelength of about 300 nm to 500 nm, into a long wavelength component having of lower energy, i.e., of a wavelength of about 600 nm to 1,100 nm.

For example, the semiconductor nanocrystals according to the example embodiment of the present invention convert ultraviolet or blue light (wavelength of about 350 nm to 500 nm) into red light (wavelength of about 600 nm to 630 nm) and emits the red light.

Therefore, when light (such as sunlight) is incident upon the solar cell or the solar cell module, the energy of the light is first converted into low energy, i.e., a short wavelength of the light is converted into a long wavelength, by the semiconductor nanocrystals contained or dispersed within a designated layer, and then the light having the low energy is supplied to the solar cells. Thus, the solar cell or a module thereof in accordance with the present invention increases light transmittance at a wavelength of 500 nm to 1,200 nm by 90% or more as compared to a conventional solar cell or a module thereof, and eventually increases the photoelectric conversion efficiency.

Since the solar cell or a module thereof in accordance with an embodiment of the present invention is characterized in that the number of photons of light emitted by the semiconductor nanocrystals is greater than the number of photons of light incident upon the semiconductor nanocrystals, the solar cell or the module thereof increases light absorption and increases an amount of current generated by the solar cells or the module thereof, thereby improving the photoelectric conversion efficiency.

The semiconductor nanocrystals may be dispersed in a layer, within which the semiconductor nanocrystals are to be contained, at a proper or predetermined rate. Preferably, but not necessarily, an amount of the semiconductor nanocrystals may be about 1% to 10% by weight relative to the weight of the layer within which the semiconductor nanocrystals are to be contained.

As the amount of the semiconductor nanocrystals in a layer increases, light that is incident on the solar cell or the module thereof may be shielded. Thus, an amount of the semiconductor nanocrystals that is contained in the layer may be measured so that a sufficient amount of the semiconductor nanocrystals are contained in the layer without excessively acting as a shield. Such a measured amount of the semiconductor nanocrystals that is contained in the layer may be predetermined, and be about 1% to 90% by weight relative to the weight of the layer within which the semiconductor nanocrystals are to be contained, and preferably, but not necessarily, be about 1% to 10% by weight relative to the weight of the layer within which the semiconductor nanocrystals are to be contained.

The semiconductor nanocrystals may be crystals of at least one kind selected from the group consisting of group IV elements, group IIA-VIB compounds, group IIIA-VB compounds, group IIIB-VB compounds, or combinations thereof. Concretely, the semiconductor nanocrystals may be crystals of Si, Ge, MgS, ZnS, MgSe, ZnSe, AlP, GaP, AlAs, GaAs, CdS, CdSe, InP, InAs, GaSb, AlSb, ZnTe, CdTe and InSb, or mixed crystals including these elements or compounds. The semiconductor nanocrystals are preferably, but not necessarily, crystals of AlP, GaP, Si, ZnSe, AlAs, GaAs, CdS, InP, ZnTe, AlSb, CdTe and CdSe, and more preferably, but not necessarily, crystals of ZnSe, CdSe, GaAs, CdS, InP, ZnTe and CdTe, which are direct-gap semiconductors, because they have high light emission efficiency.

The semiconductor nanocrystals may be dispersed in the layer within which the semiconductor nanocrystals are to be contained, thus being used to manufacture the solar cell or the module thereof. In the example embodiment of the present invention, the semiconductor nanocrystals are not limited to a specific form, but may have a nanoparticle form dispersed in the layer and preferably, but not necessarily, have a core-shell structure. In this instance, the cores and the shells of the semiconductor nanocrystals may be made of the same material or different materials selected from the above-described materials (elements or compounds).

The semiconductor nanocrystals having the above core-shell structure may be formed by coating surfaces of core particles containing CdSe (band gap: 1.74 eV) with shells made of a semiconductor material having a high band gap, such as ZnS (band gap: 3.8 eV). Although this instance illustrates the cores and the shells of the semiconductor nanocrystals as being made of different materials, the cores and the shells may be made of the same material. The semiconductor nanocrystals having such a core-shell structure may improve a shielding effect of electrons generated from the core particles.

The semiconductor nanocrystals having the core-shell structure may be manufactured through a dispersion method of a known thin film deposition process. For example, the semiconductor nanocrystals having a CdSe core-ZnS shell structure may be manufactured by putting a precursor solution, in which diethyl zinc and trimethysilyl sulfide are mixed with TOP, into a TOPO solution, within which CdSe core particles are dispersed, and heated to a temperature of about 140° C.

If the semiconductor nanocrystals are made of S or Se, the structure of the nanocrystals is easily broken by active ingredients, such as other unreacted monomers contained in the layer, within which the semiconductor nanocrystals are to be contained, or moisture. Therefore, in order to prevent or reduce such a problem, surface modification using a metal oxide, such as silica, or an organic compound may be carried out.

Further, the surfaces of the particles of the semiconductor nanocrystals may be modified or coated, for example, with long-chain alkyl groups, phosphate or resin, in order to improve dispersibility of the layer within which semiconductor nanocrystals are to be contained.

Further, a transparent resin film may be made of a known material which maintains dispersion of the semiconductor nanocrystals, and be an organic resin film or a fluoride resin film. The organic resin film may be made of a transparent resin (polymer), such as polymethyl methacrylate, polyacrylate, polycarbonate, polyvinyl alcohol, polyvinylpyrrolidone, hydroxyethyl cellulose, or carboxymethyl cellulose, or a combination thereof.

Further, the organic resin film may be made of a monomer, an oligomer, or a polymer of polyvinyl chloride resin, melamine resin, phenolic resin, alkyd resin, epoxy resin, polyurethane resin, polyester resin, maleic resin, or polyamide resin, or a combination thereof. These transparent resins may be heat curable. Further, one kind of these resins may be independently used, or plural kinds of these resins may be mixed and used.

The semiconductor nanocrystals may be dispersed within at least one layer selected from the at least one transparent member, the at least one anti-reflection layer, and the filling layer through a spin coating method or a spray coating method. However, dispersion of the semiconductor nanocrystals into the at least one selected layer is not limited to the above method, but may employ any one of known nanoparticle dispersion methods.

In more detail, particles of semiconductor nanocrystals or the manufactured semiconductor nanocrystals having the core-shell structure may be mixed with a material of the layer within which the semiconductor nanocrystals are to be contained, a proper solvent is added to the mixture, and the mixture is agitated through a milling method of an ultrasonic dispersion method, thereby manufacturing a dispersion solution. Thereafter, the manufactured dispersion solution is applied to a solar cell structure and then dried, thereby forming the layer within which the semiconductor nanocrystals are contained.

In order to apply the dispersion solution to a solar cell substrate, a known solution impregnation method, spraying method, or method using a roller cutter, a land cutter, or a spinner may be used.

In accordance with the example embodiment of the present invention, the layer within which the semiconductor nanocrystals are contained may be formed on the solar cells by patterning. In this instance, the pattern of the layer may be formed by photolithography or various printing methods using the above-manufactured dispersion solution.

Although the embodiments of the present invention have been disclosed for illustrative purposes, those skilled in the art will appreciate that various modifications, additions and substitutions are possible, without departing from the scope and spirit of the invention as disclosed in the accompanying claims. Further, those skilled in the art will appreciate that materials of the above-described respective components may be easily replaced with various known materials. Further, those skilled in the art will appreciate that some of the above-described components are omitted without causing deterioration of the solar cell or the module thereof or other components may be added to improve performance of the solar cell or the module thereof. Moreover, those skilled in the art will appreciate that the procedure of the above-described method may be changed according to process environment or equipment. Therefore, the scope and spirit of the invention will be determined by the accompanying claims and equivalents thereof rather than only the above-described embodiments.

What is claimed is:
1. A solar cell, comprising:
 a photoelectric conversion layer including a silicon semiconductor substrate upon which light is incident;
 a first anti-reflection layer formed on the photoelectric conversion layer;

a first electrode connected to the photoelectric conversion layer, wherein the entire first electrode penetrates the first anti-reflection layer;

a second anti-reflection layer formed on the first anti-reflection layer and on an upper surface of the first electrode upon which the light is incident, the second anti-reflection layer containing semiconductor nanocrystal particles; and a sealing layer disposed on the second anti-reflection layer, wherein a refractive index of the second anti-reflection layer is 1.5 to 2.0, and wherein an amount of the semiconductor nanocrystal particles is about 1% to 10% by weight relative to a weight of the second anti-reflection layer within which the semiconductor nanocrystal particles are contained.

2. The solar cell according to claim 1, wherein the first electrode is connected to the photoelectric conversion layer on an upper surface of the photoelectric conversion layer upon which the light is incident, and wherein the first anti-reflection layer includes at least one layer and is directly formed on the upper surface of the photoelectric conversion layer such that the first electrode is connected to the photoelectric conversion layer through the first anti-reflection layer, and the first anti-reflection layer does not include the semiconductor nanocrystal particles.

3. The solar cell according to claim 1, wherein the semiconductor nanocrystal particles have a core-shell structure, and materials of cores and shells of the semiconductor nanocrystal particles are the same or different.

4. The solar cell according to claim 3, wherein the semiconductor nanocrystal particles are crystals of at least one kind selected from the group consisting of group IIA-VIA compounds, group IIIA-VA compounds, group IIB-VIA compounds, or a combination thereof.

5. The solar cell according to claim 4, wherein the semiconductor nanocrystal particles include one of MgS, ZnS, MgSe, ZnSe, AlP, GaP, AlAs, GaAs, CdS, CdSe, InP, InAs, GaSb, AlSb, ZnTe, CdTe and InSb, mixed crystals including these elements and compounds.

6. The solar cell according to claim 3, wherein the shells of the semiconductor nanocrystal particles have a band gap larger than a band gap of the cores of the semiconductor nanocrystal particles.

7. The solar cell according to claim 6, wherein the cores of the semiconductor nanocrystal particles include CdSe and the shells of the semiconductor nanocrystal particles include ZnS.

8. The solar cell according to claim 3, wherein the semiconductor nanocrystal particles are modified or coated with long-chain alkyl groups, phosphate or a resin.

9. The solar cell according to claim 1, further comprising a second electrode, wherein the photoelectric conversion layer includes the silicon semiconductor substrate of a first conductivity-type and an emitter layer doped with a second conductivity-type impurity and provided on the semiconductor substrate, wherein the first electrode is connected to the emitter layer, and wherein the second electrode is connected to the semiconductor substrate.

10. The solar cell according to claim 1, wherein the second anti-reflection layer directly contacts the first electrode and the first anti-reflection layer.

11. The solar cell according to claim 1, wherein the sealing layer is formed of Ethylene Vinyl Acetate copolymer (EVA).

12. The solar cell according to claim 1, wherein the semiconductor nanocrystal particles convert light of a wavelength of about 300 nm to 500 nm into light of a wavelength of about 600 nm to 1100 nm.

13. The solar cell according to claim 1, wherein surfaces of the semiconductor nanocrystal particles are modified using a metal oxide or an organic compound.

14. The solar cell according to claim 1, wherein the sealing layer disposed on the second anti-reflection layer does not contact the first electrode.

* * * * *